United States Patent
Horiuchi et al.

(10) Patent No.: US 11,978,831 B2
(45) Date of Patent: May 7, 2024

(54) LIGHT EMITTING DEVICE

(71) Applicant: Shinko Electric Industries Co., LTD., Nagano-ken (JP)

(72) Inventors: Michio Horiuchi, Nagano (JP); Masaya Tsuno, Matsumoto (JP)

(73) Assignee: Shinko Electric Industries Co., LTD., Nagano-ken (JP)

(*) Notice: Subject to any disclaimer, the term of this patent is extended or adjusted under 35 U.S.C. 154(b) by 291 days.

(21) Appl. No.: 17/346,232

(22) Filed: Jun. 12, 2021

(65) Prior Publication Data

US 2021/0391508 A1 Dec. 16, 2021

(30) Foreign Application Priority Data

Jun. 15, 2020 (JP) .................... 2020-103068

(51) Int. Cl.
*H01L 33/48* (2010.01)
*H01L 25/075* (2006.01)
*H01L 33/50* (2010.01)
*H01L 33/60* (2010.01)
(Continued)

(52) U.S. Cl.
CPC ........ *H01L 33/486* (2013.01); *H01L 25/0753* (2013.01); *H01L 33/50* (2013.01); *H01L 33/60* (2013.01); *H01L 33/62* (2013.01); *H01L 33/642* (2013.01); *H01L 2933/0041* (2013.01);
(Continued)

(58) Field of Classification Search
CPC ....... H01L 33/486; H01L 33/60; H01L 33/50; H01L 23/10; H01L 25/0753
See application file for complete search history.

(56) References Cited

U.S. PATENT DOCUMENTS

| 2006/0054913 A1* | 3/2006 | Hadame | H01L 24/97 |
| | | | 257/E33.059 |
| 2008/0023713 A1* | 1/2008 | Maeda | H01L 33/486 |
| | | | 257/E33.072 |
| 2011/0284902 A1 | 11/2011 | Daicho et al. | |

(Continued)

FOREIGN PATENT DOCUMENTS

| JP | 2006-073699 A | 3/2006 |
| JP | 2008-543041 A | 11/2008 |

(Continued)

OTHER PUBLICATIONS

Japanese Office Action dated Aug. 14, 2023, in connection with Japanese Application No. 2020-103068.

(Continued)

*Primary Examiner* — Walter H Swanson
*Assistant Examiner* — Jacob T Nelson
(74) *Attorney, Agent, or Firm* — Wolf, Greenfield & Sacks, P.C.

(57) ABSTRACT

A light emitting device includes a light-transmissive ceramic substrate, a light emitting element mounted on the ceramic substrate, a wiring arranged inside the ceramic substrate and electrically connected to the light emitting element, a base material faced to the ceramic substrate, and a seal member hermetically sealing a gap between the ceramic substrate and the base material. The light emitting element is arranged in a space surrounded by the ceramic substrate, the base material, and the seal member. The wiring includes a wiring layer extending in a planar direction of the ceramic substrate.

10 Claims, 10 Drawing Sheets

(51) Int. Cl.
*H01L 33/62* (2010.01)
*H01L 33/64* (2010.01)

(52) U.S. Cl.
CPC .............. *H01L 2933/0058* (2013.01); *H01L 2933/0066* (2013.01); *H01L 2933/0075* (2013.01)

(56) References Cited

U.S. PATENT DOCUMENTS

| | | | | |
|---|---|---|---|---|
| 2012/0091500 | A1* | 4/2012 | Matoba | H01L 33/486 257/E33.056 |
| 2017/0279019 | A1* | 9/2017 | Ueda | H01L 33/56 |
| 2019/0123509 | A1* | 4/2019 | Hashimoto | H01S 5/405 |

FOREIGN PATENT DOCUMENTS

| | | |
|---|---|---|
| JP | 2009-212281 A | 9/2009 |
| JP | 2010-177375 A | 8/2010 |
| WO | WO 2006/126123 A1 | 11/2006 |
| WO | WO 2010/061592 A1 | 6/2010 |

OTHER PUBLICATIONS

Japanese Office Action dated Nov. 7, 2023, in connection with Japanese Application No. 2020-103068.

* cited by examiner

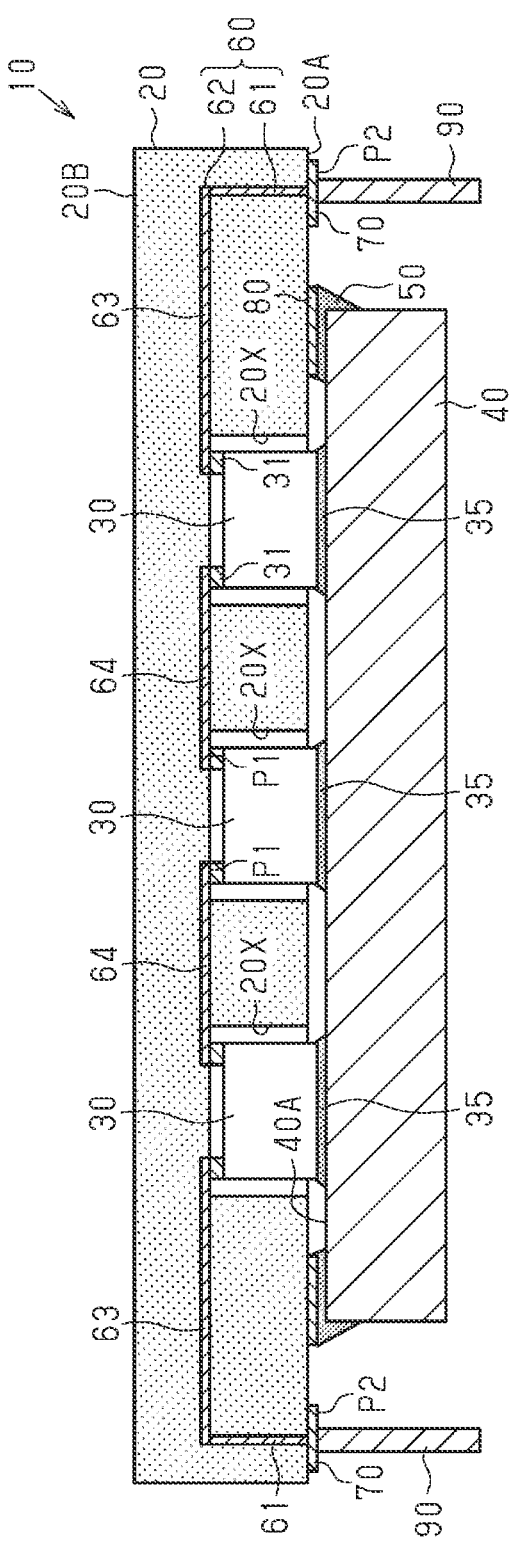
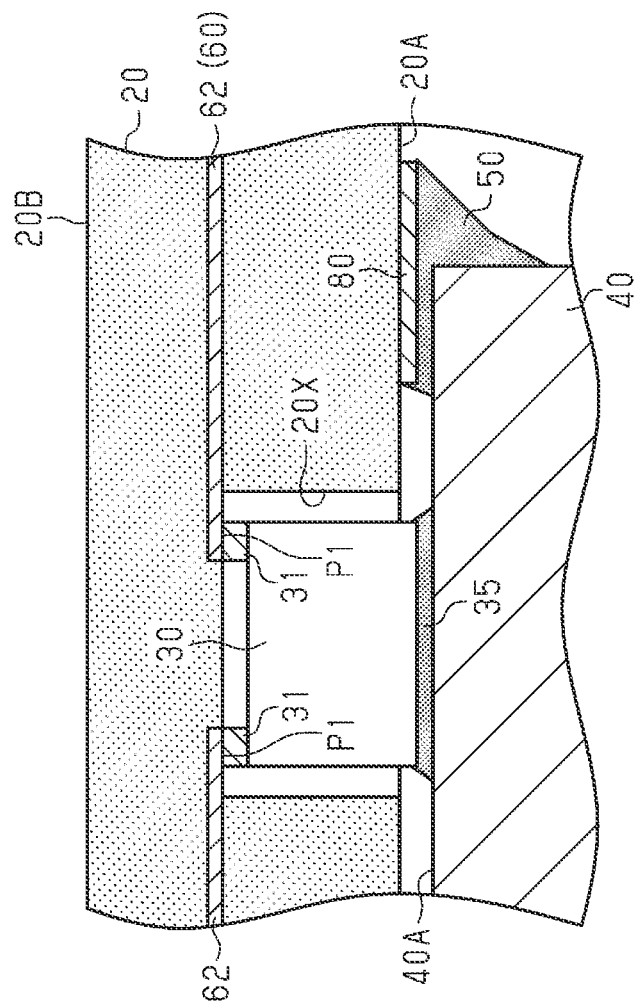

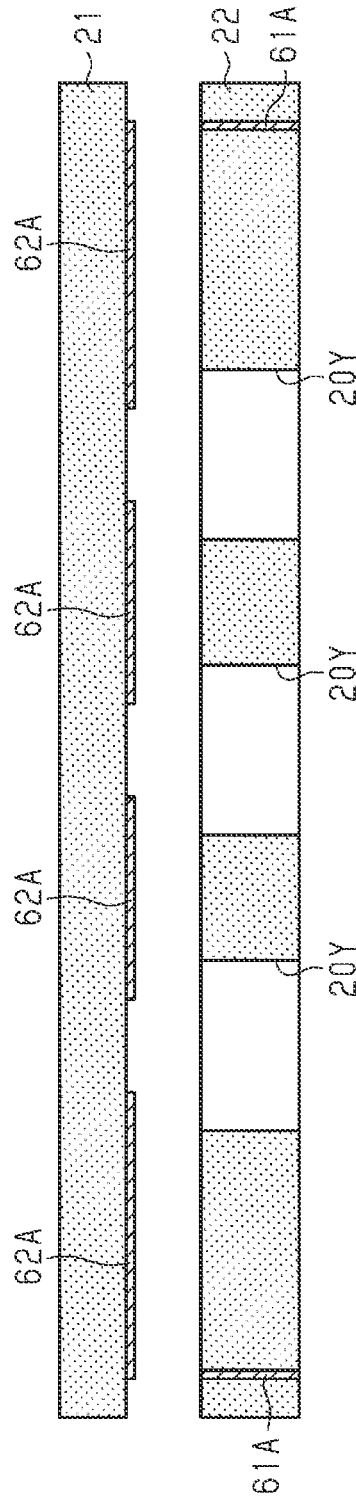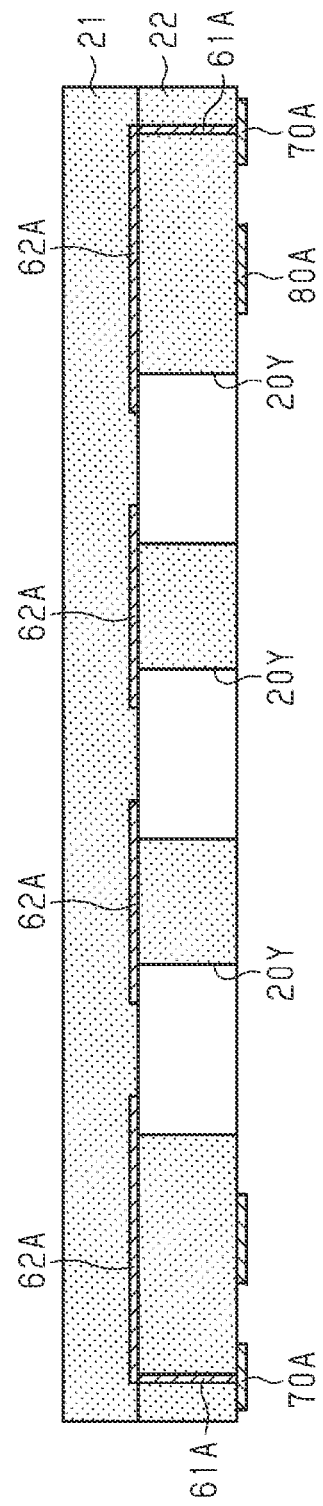

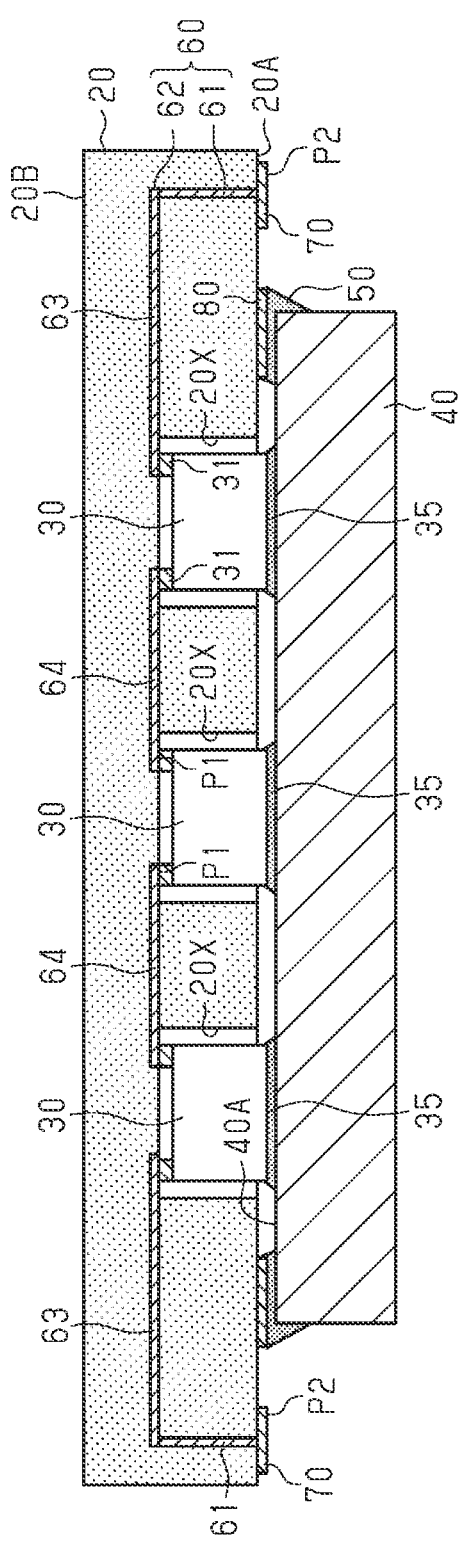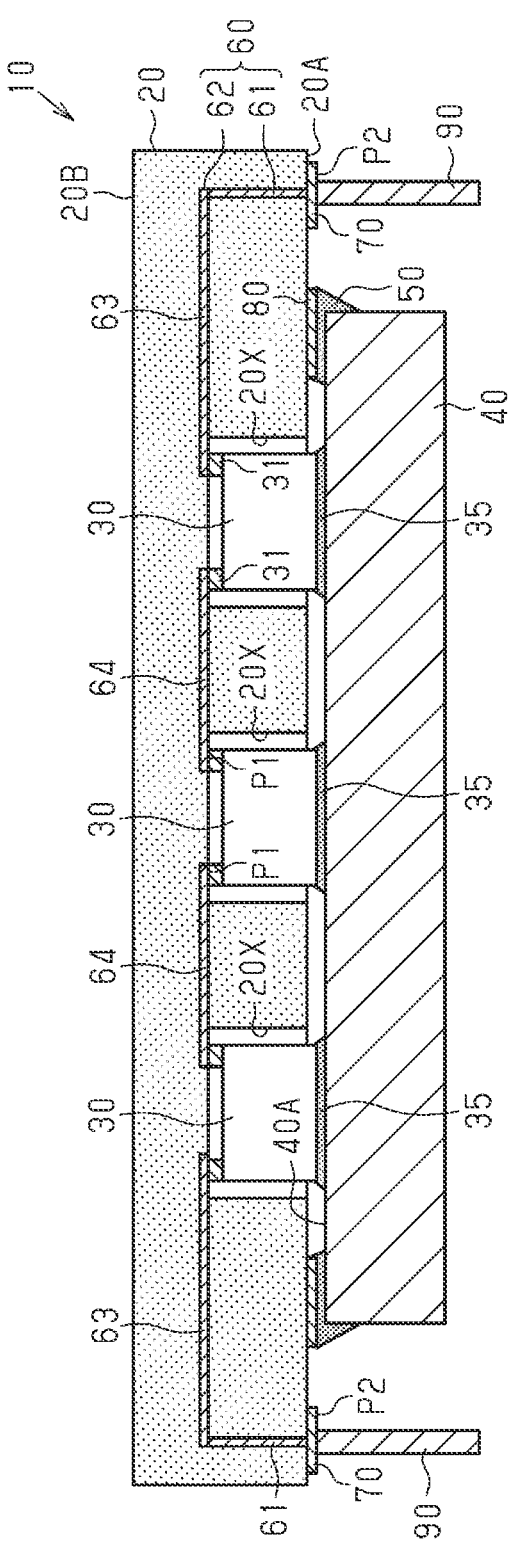

LIGHT EMITTING DEVICE

CROSS-REFERENCE TO RELATED APPLICATIONS

This application is based upon and claims the benefit of priority from prior Japanese Patent Application No. 2020-103068, filed on Jun. 15, 2020, the entire contents of which are incorporated herein by reference.

FIELD

This disclosure relates to a light emitting device.

BACKGROUND

Light emitting devices including a substrate and a light emitting element mounted on the substrate have been proposed in various shapes. Japanese Laid-Open Patent Publication No. 2009-212281 discloses this type of light emitting device including a light emitting element that is mounted on a base and covered by a light-transmissive plate. The light-transmissive plate has a facing surface faced to the base. The light emitting element is arranged between the base and the light-transmissive plate. A wiring pattern is arranged on the facing surface of the light-transmissive plate. The wiring pattern is electrically connected to an electrode of the light emitting element and a conductive pattern that is arranged on a facing surface of the base.

If the hermetical property of the light emitting device is low between the base and the light-transmissive plate, moisture may enter an accommodation region of the light emitting element through a gap between the base and the light-transmissive plate. The light emitting element deteriorates due to the moisture.

SUMMARY

An embodiment of a light emitting device includes a light-transmissive ceramic substrate, a light emitting element mounted on the ceramic substrate, a wiring arranged inside the ceramic substrate and electrically connected to the light emitting element, a base material faced to the ceramic substrate, and a seal member hermetically sealing a gap between the ceramic substrate and the base material. The light emitting element is arranged in a space surrounded by the ceramic substrate, the base material, and the seal member. The wiring includes a wiring layer extending in a planar direction of the ceramic substrate.

BRIEF DESCRIPTION OF THE DRAWINGS

The embodiments, together with objects and advantages thereof, may best be understood by reference to the following description of the presently preferred embodiments together with the accompanying drawings in which:

FIG. 1A is a schematic cross-sectional view illustrating an embodiment of a light emitting device (cross-sectional view taken along line 1-1 in FIG. 2);

FIG. 1B is a partial enlarged cross-sectional view of the light emitting device illustrated in FIG. 1A;

FIGS. 3A, 3B, 4A, 4B, 5A, and 5B are schematic cross-sectional views illustrating a method for manufacturing an embodiment of a light emitting device.

DESCRIPTION OF THE EMBODIMENTS

Figure 2:
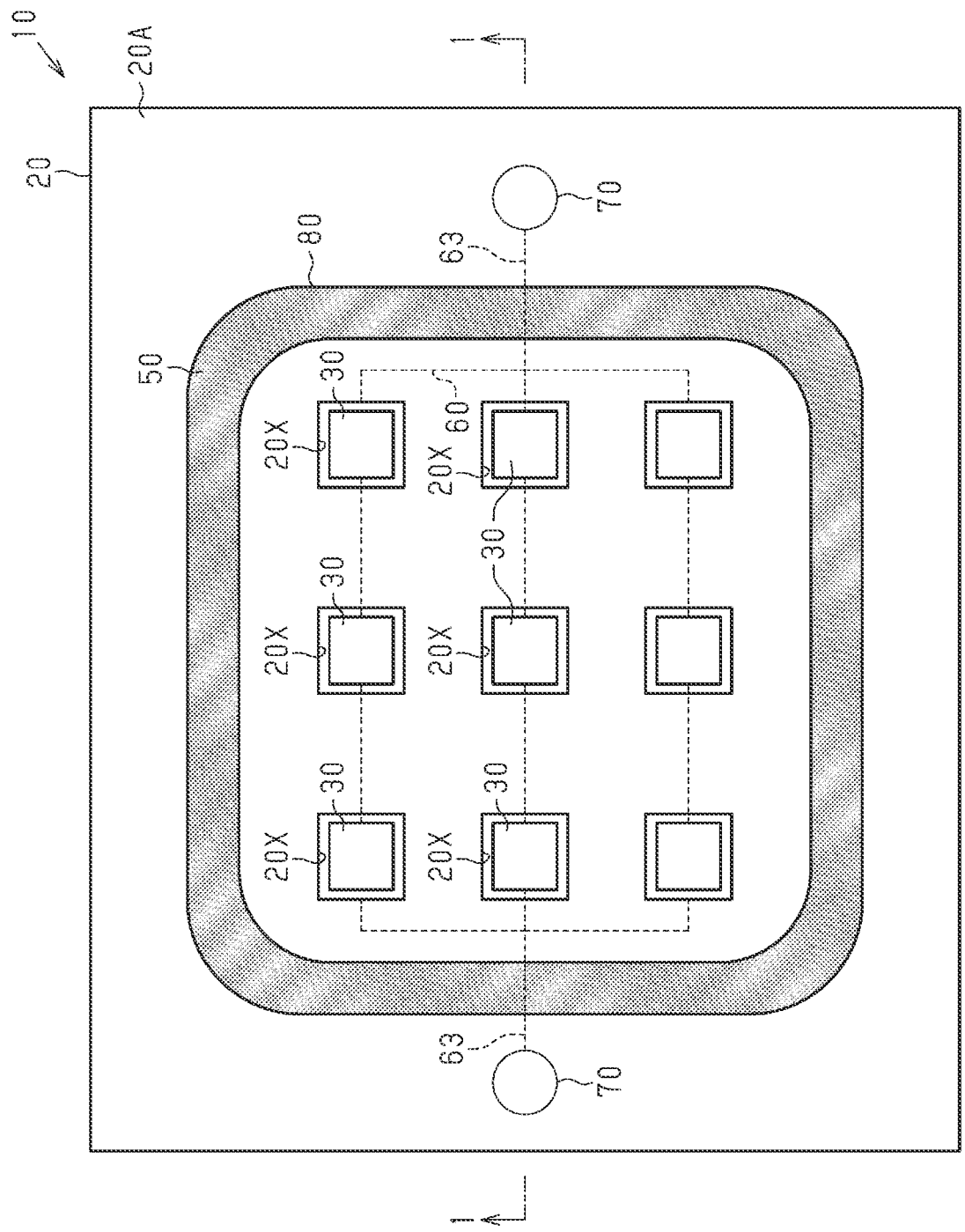
FIG. 2 is a schematic plan view of the light emitting device illustrated in FIG. 1.

An embodiment will now be described with reference to the accompanying drawings. Elements in the drawings may be partially enlarged for simplicity and clarity and thus have not necessarily been drawn to scale. To facilitate understanding, hatching lines may not be illustrated or be replaced by shadings in the cross-sectional drawings. In this specification, "plan view" refers to a view of a subject taken in a vertical direction (for example, upper-lower direction in FIG. 1A), and "planar shape" refers to a shape of a subject taken in the vertical direction.

General Structure of Light Emitting Device 10

As illustrated in FIG. 1A, a light emitting device 10 includes, for example, a ceramic substrate 20, one or more (in the present embodiment, nine) light emitting elements 30 mounted on the ceramic substrate 20, a heat dissipation member 40 faced to the ceramic substrate 20, and a seal member 50. Wirings 60 are arranged inside the ceramic substrate 20 and electrically connected to the light emitting elements 30. Examples of the light emitting element 30 include a light emitting element that is gallium arsenide phosphide (GaAsP) based, gallium phosphide (GaP) based, aluminum gallium arsenide (AlGaAs) based, aluminum gallium indium phosphide (AlGaInP) based, or indium gallium nitride (InGaN) based. Each light emitting element 30 of the present embodiment is an InGaN-based light emitting element that emits light of a blue wavelength.

In this specification, the terms "faced" and "facing" refer to a state in which surfaces or members are located in front of each other. The terms are not limited to a state in which surfaces or members are located completely in front of each other and include a state in which surfaces or members are located partially in front of each other. In this specification, the terms "faced" and "facing" further include both a state in which two parts are located with another member located between the two parts and a state in which another member is not located between the two parts.

Structure of Ceramic Substrate 20

The ceramic substrate 20 includes a light-transmissive ceramic. Examples of ceramics include an oxide ceramic and a non-oxide ceramic. Examples of oxide ceramics include an aluminum oxide ($A_2O_3$, hereafter, also referred to as "alumina") and zirconia ($ZrO_2$). Examples of non-oxide ceramics include aluminum nitride (AlN) and silicon nitride ($Si_3N_4$). The ceramic substrate 20 is, for example, a polycrystalline ceramic (polycrystal). Examples of polycrystalline ceramics include a polycrystalline alumina and a polycrystalline aluminum nitride.

In the present embodiment, the ceramic substrate 20 is an alumina substrate including alumina as a main component. In the present embodiment, alumina is a polycrystal, that is, a polycrystalline alumina. In this specification, "including alumina as a main component" refers to including alumina in the largest portion of the materials forming the alumina substrate. The purity of alumina is, for example, preferably 90% or higher, more preferably, 95% or higher, and, further preferably, 99.5% or higher.

The material composition of the ceramic substrate 20 may be a composition in which, for example, alumina is the main component and an yttrium oxide and a lanthanoid oxide are added and mixed with alumina. The ceramic substrate 20 has, for example, a garnet phase. An example of a garnet phase is an yttrium aluminum garnet (YAG, $Y_3Al_5O_{12}$) phase. The yttrium aluminum garnet phase is doped with the lanthanoid oxide. The garnet phase including the lanthanoid oxide serves as a fluorescence substance. A lanthanoid element, that is, a chemical element in the lanthanoid series, may be, for example, one or more elements selected from the group consisting of cerium (Ce), europium (Eu), erbium (Er), ytterbium (Yb), thulium (Tm), and neodymium (Nd). When the light emitting elements 30 are configured to emit light of a blue wavelength, cerium is a suitable lanthanoid element for the light emitting device 10 to emit white light. The yttrium aluminum garnet phase including cerium serves as a yellow fluorescence substance that emits yellow light. The yellow fluorescence substance partially absorbs the blue light emitted from the light emitting elements 30 and emits yellow fluorescent light. As a result, the yellow light is mixed with the blue light that was not absorbed by the yellow fluorescence substance to produce light of a mixed wavelength forming simulated white light. Further, when the yttrium aluminum garnet phase is doped with europium as a lanthanoid element in addition to cerium, fluorescent light in a red wavelength range is obtained. This increases the color rendering index of the white light. The amount of the fluorescence substance formed by the garnet phase may be adjusted, for example, to obtain an appropriate mixed wavelength in accordance with the emission intensity and the wavelength band of the light emitting elements 30. Thus, the ceramic substrate 20 including the fluorescence substance has a wavelength conversion functionality.

The content of the garnet phase may be set to be, for example, 3 mol % or greater and 50 mol % or less. For example, the content of the yttrium aluminum garnet phase may be set to be, for example, 3 mol % or greater and 10 mol % or less. The content of a lanthanoid element may be set to, for example, 0.2 mol % or greater and 10 mol % or less in terms of oxide. For example, the content of cerium may be set to, for example, 0.2 mol % or greater and 1 mol % or less in terms of oxide.

The ceramic substrate 20 is light-transmissive. For example, silicon (Si) may be added as an impurity to the material composition of the ceramic substrate 20. This improves the optical properties of the ceramic substrate 20. For example, an oxide such as silicon dioxide ($SiO_2$) may be used so that a small amount of silicon is added as an impurity. This improves the light-transmissive properties of the ceramic substrate 20. The content of silicon may be set to be, for example, 0.001 mol % or greater and 1.0 mol % or less.

The ceramic substrate 20 is, for example, plate-shaped. The ceramic substrate 20 includes a lower surface 20A and an upper surface 20B. The ceramic substrate 20 includes recesses 20X. The recesses 20X are arranged in the lower surface 20A of the ceramic substrate 20, which faces the heat dissipation member 40. The recesses 20X are recessed from the lower surface 20A of the ceramic substrate 20 toward the upper surface 20B of the ceramic substrate 20. Each recess 20X has a bottom surface located at an intermediate position of the ceramic substrate 20 in the thickness-wise direction.

As illustrated in FIG. 2, the recesses 20X are separated from each other. The recesses 20X are arranged in a matrix (in the present embodiment, 3×3) in plan view. The recesses 20X are arranged, for example, at a planar center of the ceramic substrate 20.

Each recess 20X may have any planar shape. The planar shape of the recess 20X may be, for example, rectangular or circular. In the present embodiment, the planar shape of the recess 20X is rectangular.

As illustrated in FIG. 1A, the light emitting device 10 includes, for example, the wirings 60 arranged inside the ceramic substrate 20, two electrode terminals 70 arranged on the lower surface 20A of the ceramic substrate 20, a metal layer 80 arranged on the lower surface 20A of the ceramic substrate 20. The material of the wirings 60 and the electrode terminals 70 may be, for example, a high-melting-point metal. The material of the wirings 60 and the electrode terminals 70 may be, for example, a metal material, the main component of which is at least one metal selected from the group consisting of tungsten (W), molybdenum (Mo), platinum (Pt), and palladium (Pd). The wirings 60 and the electrode terminals 70 contain, for example, 90 wt % or greater of tungsten or molybdenum. The material of the wirings 60 may be the same or differ from the material of the electrode terminals 70.

The wirings 60 are, for example, electrically connected to the light emitting elements 30. The wirings 60, for example, electrically connect the light emitting elements 30 to the two electrode terminals 70. The wirings 60, for example, electrically connect the light emitting elements 30 to each other. The wirings 60, for example, connect the light emitting elements 30 in parallel or in series. The wiring 60, in another example, connects the light emitting elements 30 in parallel and in series.

As illustrated in FIG. 2, in the present embodiment, the wirings 60 connect multiple (in the example illustrated in FIG. 2, 9) light emitting elements 30 in parallel and in series. In the example illustrated in FIG. 2, each group of three of the light emitting elements 30 arranged in a row (in sideward direction in FIG. 2) between the electrode terminals 70 are connected in series by the wirings 60. In addition, in the example illustrated in FIG. 2, three groups of each group of three of the light emitting elements 30 connected in series (three series circuits) are connected in parallel by the wirings 60.

As illustrated in FIG. 1A, the wirings 60 include wiring layers 61 that are electrically connected to the electrode terminals 70 and wiring layers 62 that extend in a planar direction of the ceramic substrate 20. The planar direction of the ceramic substrate 20 is a direction orthogonal to the thickness-wise direction of the ceramic substrate 20 in cross-sectional view.

The wiring layers 61 are, for example, directly connected to the respective electrode terminals 70. The lower surface of each wiring layer 61 is exposed from the lower surface 20A of the ceramic substrate 20. The lower surface of the wiring layer 61 is flush with the lower surface 20A of the ceramic substrate 20. The lower surface of the wiring layer 61 is directly connected to the upper surface of the electrode terminal 70. Thus, the wiring layer 61 is electrically connected to the electrode terminal 70. The wiring layer 61 is rod-shaped and extends upward from the lower surface 20A of the ceramic substrate 20. The upper surface of the wiring layer 61 is connected to the lower surface of the wiring layer 62.

The wiring layers 62 include, for example, wiring layers 63, which are directly connected to the wiring layers 61, and wiring layers 64, which are spaced apart from the wiring layers 63 in the planar direction of the ceramic substrate 20 (sideward direction in FIG. 1A). The wiring layers 63 are coplanar with the wiring layers 64.

The wiring layers 63 are, for example, elongated so as to extend in the planar direction of the ceramic substrate 20. The wiring layers 63 are arranged, for example, in a peripheral region of the ceramic substrate 20. Each wiring layer 63 has two longitudinal ends. For example, the lower surface of one of the longitudinal ends is connected to the upper surface of the wiring layer 61, and the lower surface of the other longitudinal end is exposed to the bottom of the recess 20X. The lower surface of the wiring layer 63 is, for example, flush with the bottom surface of the recess 20X. The side surfaces of the wiring layer 63 are, for example, covered by the ceramic substrate 20. The wiring layer 63, for example, traverses the seal member 50 and the metal layer 80 in plan view.

The wiring layers 64 are, for example, elongated so as to extend in the planar direction of the ceramic substrate 20. The wiring layers 64 are arranged, for example, in an inner region of the ceramic substrate 20 from the wiring layers 63. Each wiring layer 64, for example, extends between adjacent ones of the recesses 20X. The wiring layer 64 has two longitudinal ends. For example, the lower surface of each longitudinal end is exposed to the bottom of a different one of the recesses 20X. For example, the lower surface of one end of the wiring layer 64 is exposed to the bottom of one of the adjacent recesses 20X, and the lower surface of the other end of the wiring layer 64 is exposed to the bottom of the other one of the adjacent recesses 20X. The lower surfaces of the wiring layer 64 are, for example, flush with the bottom surfaces of the recesses 20X. The side surfaces of the wiring layer 64 are, for example, covered by the ceramic substrate 20.

The lower surfaces of the wiring layers 62 (i.e., wiring layers 63 and 64) exposed to the bottom of the recesses 20X serve as connection pads P1 that are connected to the light emitting elements 30. Two connection pads P1 are arranged in the bottom of each recess 20X.

A surface-processed layer may be formed on the lower surface of the wiring layer 62 exposed to the bottom of the recess 20X where appropriate. Examples of the surface-processed layer include a gold (Au) layer, a nickel (Ni) layer/Au layer (metal layer in which Ni layer is used as bottom layer, and Au layer is formed on Ni layer), and a Ni layer/palladium (Pd) layer/Au layer (metal layer in which Ni layer is used as bottom layer, and Ni layer, Pd layer, and Au layer are sequentially stacked). The Au layer is a metal layer formed from Au or an Au alloy. The Ni layer is a metal layer formed from Ni or a Ni alloy. The Pd layer is a metal layer formed from Pd or a Pd alloy. Each of the Au layer, the Ni layer, and the Pd layer may be, for example, a metal layer (electroless plated layer) formed through an electroless plating process or a metal layer (electrolytic plated layer) formed through an electrolytic plating process. Another example of the surface-processed layer may be an organic solderability preservative (OSP) film formed on the lower surface of the wiring layer 62 exposed to the bottom of the recess 20X through an anti-oxidation process such as an OSP process. The OSP film may be, for example, a coating of an organic compound such as an azole compound or an imidazole compound. When a surface-processed layer is formed on the lower surface of the wiring layer 62 exposed to the bottom of the recess 20X, the surface-processed layer serves as the connection pad P1.

As described above, the wirings 60, which include the wiring layers 61 and 62, are arranged inside the ceramic substrate 20 and extend over the seal member 50 and the metal layer 80. The wirings 60 are spaced apart from the metal layer 80 and the seal member 50 by the ceramic substrate 20. Thus, the wirings 60 are electrically insulated from the metal layer 80 and the seal member 50.

The electrode terminals 70 are arranged on the lower surface 20A of the ceramic substrate 20 at an outer side of the seal member 50. The upper surface of each electrode terminal 70 is directly connected to the lower surface of the wiring layer 61. The lower surface of the electrode terminal 70 includes an external connection pad P2 configured to be connected to, for example, an external connection terminal 90. The electrode terminals 70 are supplied with power through the external connection terminals 90, for example, from an external power supply (not illustrated). The electrode terminals 70 include, for example, a positive electrode terminal and a negative electrode terminal. The external connection terminals 90 may be, for example, solder bumps, solder balls, and/or lead pins. In the present embodiment, the external connection terminals 90 are lead pins.

Each electrode terminal 70 may have any planar shape. The planar shape of the electrode terminal 70 may be rectangular or circular. As illustrated in FIG. 2, in the present embodiment, the planar shape of the electrode terminal 70 is circular.

As illustrated in FIG. 1A, the metal layer 80 is arranged on the lower surface 20A of the ceramic substrate 20. In plan view, the metal layer 80 is arranged between the connection pads P1 and the electrode terminals 70 (external connection pads P2). For example, in plan view, the metal layer 80 is arranged between the light emitting elements 30 and the electrode terminals 70. For example, in plan view, the metal layer 80 partially overlaps the heat dissipation member 40. For example, in plan view, the metal layer 80 partially extends to a region located at an outer side of the heat dissipation member 40.

As illustrated in FIG. 2, the metal layer 80 is frame-shaped. The metal layer 80 has, for example, the shape of a rectangular frame. In plan view, the metal layer 80 is entirely continuous and looped without no discontinuity and thus has an endless structure in which the starting point coincides with the ending point. In plan view, the metal layer 80 surrounds the light emitting elements 30. In other words, the light emitting elements 30 are arranged in a region located at an inner side of the metal layer 80. For example, the metal layer 80 may be annularly arranged to surround the light emitting elements 30 in plan view. Further, the metal layer 80 may overlap the seal member 50 in plan view. The term "annular" or "annularly" as used in this specification may refer to any structure that forms a loop, or a continuous shape with no ends. "Annular" shapes include but are not limited to a circular shape, an elliptic shape, and a polygonal shape with sharp or rounded corners.

The material of the metal layer 80 may be, for example, a metal material having a high wettability to the low-melting-point alloy forming the seal member 50. The material of the metal layer 80 may be, for example, a metal material having a higher wettability to the low-melting-point alloy than the ceramic substrate 20. The material of the metal layer 80 may be, for example, copper (Cu), a Cu alloy, nickel (Ni), or a Ni alloy. The material of the metal layer 80 may be a metal material, the main component of which is at least one metal selected from the group consisting of tungsten, molybdenum, platinum, and palladium.

As illustrated in FIG. 1B, each light emitting element 30 is mounted, for example, on the two connection pads P1 arranged on the bottom of the recess 20X. The light emitting element 30 is, for example, flip-chip-mounted on the two connection pads P1. For example, two bumps 31 are arranged on a surface (in FIG. 1B, upper surface) of the light emitting element 30. For example, in the light emitting element 30, one of the two bumps 31 is flip-chip-bonded to one of the two connection pads P1, and the other bump 31 is flip-chip-bonded to the other connection pad P1. Thus, the light emitting element 30 is electrically connected to the wiring layers 62 by the bumps 31. In the present embodiment, as illustrated in FIG. 1A, the three light emitting elements 30 are arranged in a row (in sideward direction in FIG. 1A) between the two electrode terminals 70 and are connected in series by the wiring layers 62. The light emitting elements 30 emit light when supplied with power from the external power supply (not illustrated) through the external connection terminals 90, the electrode terminals 70, and the wirings 60.

Each light emitting element 30 may have any planar shape. The planar shape of the light emitting element 30 may be, for example, rectangular or circular. In the present embodiment, the planar shape of the light emitting element 30 is rectangular.

The light emitting element 30 may be, for example, a light emitting diode (LED) or a vertical cavity surface emitting laser (VCSEL). The bumps 31 may be, for example, gold bumps or solder bumps. The material of the solder bumps may be, for example, an alloy including lead (Pb), an alloy of tin (Sn) and Au, an alloy of Sn and Cu, an alloy of Sn and silver (Ag), or an alloy of Sn, Ag, and Cu.

The light emitting elements 30 are, for example, individually accommodated in the recesses 20X. That is, each recess 20X accommodates one light emitting element 30.

As illustrated in FIG. 1B, for example, the lower portion of each light emitting element 30 projects from the recess 20X to the exterior. The lower portion of the light emitting elements 30, for example, projects downward from the lower surface 20A of the ceramic substrate 20. The lower surface of the light emitting element 30 is, for example, connected to an upper surface 40A of the heat dissipation member 40 by an adhesive 35. The light emitting element 30 is thermally connected to the heat dissipation member 40 by the adhesive 35.

The adhesive 35 may be, for example, an epoxy-based, polyimide-based, or silicone-based adhesive. In this case, the thermal conductivity of the adhesive 35 may be approximately 2 W/mK to 7 W/mK. The adhesive 35 may be a synthetic rubber-based adhesive. In this case, the thermal conductivity of the adhesive 35 may be approximately 2 W/mK to 3 W/mK. The adhesive 35 may be an adhesive having a high thermal conductivity such as a thermal interface material (TIM) member. The material of the thermal interface material member may be, for example, a soft metal such as indium (In) or silver, silicone gel or a metal filler, or an organic resin binder containing graphite. When the adhesive 35 is formed from a material having a high thermal conductivity, heat produced in the light emitting elements 30 is efficiently conducted to the heat dissipation member 40.

The heat dissipation member 40 is, for example, plate-shaped. The heat dissipation member 40, for example, dissipates the heat produced in the light emitting elements 30. The material of the heat dissipation member 40 has, for example, a thermal conductivity of, preferably, 20 W/mK or greater and, more preferably, 100 W/mK or greater. The material of the heat dissipation member 40 may be, for example, a ceramic material having a superior thermal conductivity such as aluminum nitride, silicon carbide, or alumina. The material of the heat dissipation member 40 may be, for example, a metal material having a superior thermal conductivity. The material of the heat dissipation member 40 may be, for example, a metal having a superior thermal conductivity such as copper or aluminum or an alloy including at least one of the metals having a superior thermal conductivity. When copper or aluminum is used as the material of the heat dissipation member 40, for example, a surface-processed layer may be formed on a surface of the heat dissipation member 40 to inhibit oxidation of the surface. Examples of the surface-processed layer include plating layers such as a Au layer, a Ni layer/Au layer, and a Ni layer/Pd layer/Au layer. When aluminum is used as the material of the heat dissipation member 40, for example, a zincate process may be performed on a surface of the heat dissipation member 40 and then a surface-processed layer may be formed on the surface of the heat dissipation member 40. In the present embodiment, the heat dissipation member 40 is formed from copper or a copper alloy. In the present embodiment, the heat dissipation member 40 serves as a light reflecting member that reflects the light emitted from the light emitting elements 30.

As illustrated in FIG. 1A, the heat dissipation member 40 is faced to the ceramic substrate 20 with the light emitting elements 30 located between the heat dissipation member 40 and the ceramic substrate 20. In plan view, the heat dissipation member 40 overlaps the ceramic substrate 20. In plan view, the heat dissipation member 40 overlaps a central region of the ceramic substrate 20.

The planar shape and the thickness of the heat dissipation member 40 are appropriately set, for example, in accordance with the number of light emitting elements 30 and the entire heat dissipation property required of the light emitting device 10. The heat dissipation member 40 may have any planar shape. The planar shape of the heat dissipation member 40 may be, for example, circular or rectangular. In the present embodiment, the planar shape of the heat dissipation member 40 is rectangular. The thickness of the heat dissipation member 40 may be, for example, approximately 0.5 mm to 1.0 mm.

The seal member 50 hermetically seals a gap between the ceramic substrate 20 and the heat dissipation member 40. The seal member 50 hermetically seals a gap between the lower surface 20A of the ceramic substrate 20 and the upper surface 40A of the heat dissipation member 40. The seal member 50 hermetically seals the space in which the light emitting elements 30 are arranged. The light emitting elements 30 are arranged in a space surrounded by the ceramic substrate 20, the heat dissipation member 40, and the seal member 50. That is, the light emitting elements 30 are hermetically sealed in the space between the ceramic substrate 20 and the heat dissipation member 40 by the seal member 50.

The material of the seal member 50 may be, for example, an inorganic material or a metal material. The inorganic material may be, for example, glass. An example of the glass may be a low-melting-point glass that is sealable at an operating temperature of approximately 200° C. to 300° C. An example of the metal material may be a low-melting-point alloy. An example of the low-melting-point alloy may be a solder material including two or more metals selected from the group consisting of tin, silver, copper, zinc (Zn), bismuth (Bi), and indium. In the present embodiment, the seal member 50 is formed from a low-melting-point alloy.

As illustrated in FIG. 1B, the seal member 50 is arranged, for example, on the lower surface of the metal layer 80. The seal member 50 covers, for example, the entire lower surface of the metal layer 80. The seal member 50 is arranged, for example, on the upper surface 40A of the heat dissipation member 40. The seal member 50 covers, for example, the upper surface 40A and a side surface of the heat dissipation member 40. The seal member 50 covers, for example, an upper portion of the side surface of the heat dissipation member 40. The seal member 50 is, for example, bonded to the lower surface of the metal layer 80 and the upper surface 40A and the side surface of the heat dissipation member 40.

The seal member 50 is, for example, in tight contact with the lower surface of the metal layer 80 and the upper surface 40A and the side surface of the heat dissipation member 40 with no opening.

The wirings 60 are not arranged on the portion on which the seal member 50 is arranged. That is, the wirings 60, which are electrically connected to the light emitting elements 30, are not arranged on the portion on which the seal member 50 is arranged between the ceramic substrate 20 and the heat dissipation member 40.

As illustrated in FIG. 1A, in plan view, the seal member 50 is arranged, for example, between the connection pads P1 and the electrode terminals 70 (external connection pads P2). For example, in plan view, the seal member 50 is arranged between the light emitting elements 30 and the electrode terminals 70.

As illustrated in FIG. 2, the seal member 50 is frame-shaped. The seal member 50 has, for example, the shape of a rectangular frame. In plan view, the seal member 50 is entirely continuous and looped without no discontinuity and thus has an endless structure in which the starting point coincides with the ending point. In plan view, the seal member 50 surrounds the light emitting elements 30. For example, the seal member 50 may be annularly arranged to surround the light emitting elements 30 in plan view.

Manufacturing Method of Light Emitting Device 10

A method for manufacturing the light emitting device 10 will now be described with reference to FIGS. 3A to 5B.

As illustrated in FIG. 3A, a binder, a plasticizer, and an organic solvent are dispersed and mixed with ceramic powder to form multiple (here two) green sheets 21 and 22. Through holes are formed in portions of the green sheet 22 where the wiring layers 61 (refer to FIG. 1A) will be formed. Also, through holes 20Y are formed in portions of the green sheet 22 where the recesses 20X (refer to FIG. 1A) will be formed. In the ceramic powder of the green sheets 21 and 22, for example, alumina may be a main component, and an yttrium oxide and a lanthanoid oxide may be added and mixed with alumina.

Metal layers 62A are formed on the lower surface of the green sheet 21. The metal layers 62A are baked in a subsequent step to form the wiring layers 62, which are illustrated in FIG. 1A. Metal layers 61A are formed in the through holes in the green sheet 22. The metal layers 61A are baked in a subsequent step to form the wiring layers 61, which are illustrated in FIG. 1A.

The metal layers 61A and 62A may be, for example, formed through a printing process. The metal layers 61A and 62A may be formed through, for example, a screen printing process using a metal paste. The metal paste may include, for example, a high-melting-point metal as a main component. The metal paste may be, for example, a paste in which tungsten or molybdenum is a main component and a nickel oxide, an aluminum oxide, or a silicon dioxide is mixed with an organic material.

In the step illustrated in FIG. 3B, the green sheets 21 and 22 that were formed in the step illustrated in FIG. 3A are stacked one on the other to form a stacked body.

Then, metal layers 70A, which will become the electrode terminals 70 when baked, are formed on the lower surface of the green sheet 22. Also, a metal layer 80A, which will become the metal layer 80 when baked, is formed on the lower surface of the green sheet 22. The metal layers 70A and 80A may be, for example, formed through a printing process. The metal layers 70A and 80A may be formed through, for example, a screen printing process using a metal paste. The metal paste may be, for example, formed from the same material as the metal paste that forms the metal layers 61A and 62A. The metal layers 70A and 80A may be formed in the step illustrated in FIG. 3A.

Figure 4A:
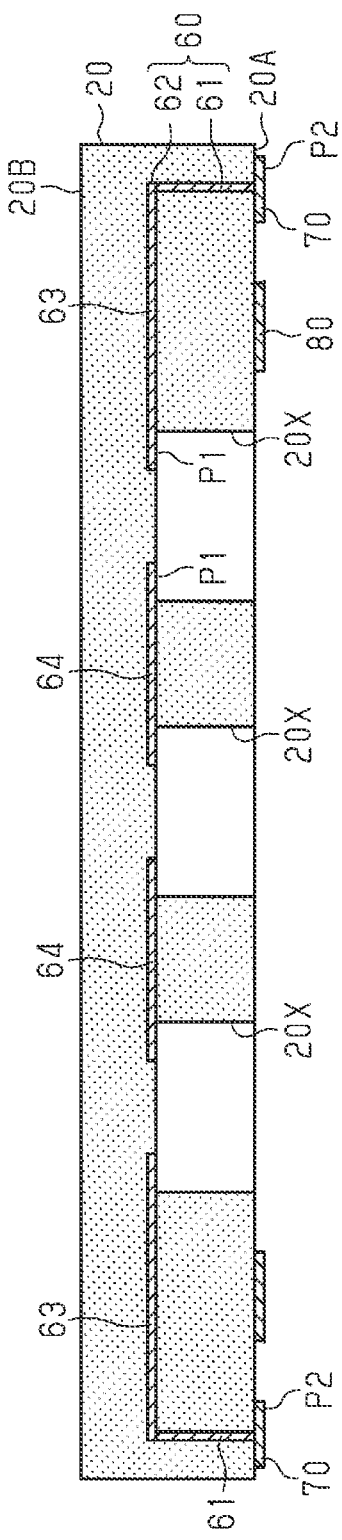

In the step illustrated in FIG. 4A, the stacked body illustrated in FIG. 3B is baked so that the green sheets 21 and 22 are integrated to form the ceramic substrate 20. The ceramic substrate 20 incorporates the wiring layers 61 and 62, which are obtained by sintering the metal layers 61A and 62A illustrated in FIG. 3B. That is, the ceramic substrate 20 incorporates the wirings 60 including the wiring layers 61 and 62. At this time, the through holes 20Y of the green sheet 22, which are illustrated in FIG. 3B, become the recesses 20X, and the wiring layers 62 are partially exposed to the bottom of each recess 20X as the connection pads P1. In addition, the electrode terminals 70 and the metal layer 80, which are obtained by sintering the metal layers 70A and 80A illustrated in FIG. 3B, are formed on the lower surface 20A of the ceramic substrate 20. The ceramic substrate 20 obtained as described above undergoes various processes. For example, the upper surface 20B of the ceramic substrate 20 is ground and polished. When the wirings 60 and the electrode terminals 70 are polished, a new metal layer may be formed on the metal surface exposed from the ceramic substrate 20 through a sputtering process or a vapor deposition process. For example, a metal layer may be formed on the lower surface of each wiring layer 62 exposed to the bottom of the recess 20X as a surface-processed layer.

The baking in this step may be performed, for example, in a reducing atmosphere or an ambient atmosphere. For example, when the ceramic substrate 20 is a ceramic including an yttrium aluminum garnet-alumina mixed layer containing cerium, it is preferred that the baking is performed in a reducing atmosphere. The inventors have verified that when the baking is performed in a reducing atmosphere, the ceramic substrate 20, that is, the sintered body, has a higher fluorescence intensity than when the baking is performed in an ambient atmosphere. It is considered that this is due to the difference in valence balance ($Ce^{+3}/Ce^{+4}$) of cerium. Therefore, the balance between an oxidation property and a reducing property of the baking atmosphere, for example, the balance between the oxygen concentration and the hydrogen concentration, may be adjusted to adjust the fluorescence intensity of the ceramic substrate 20, that is, the sintered body. During baking, the temperature is, for example, approximately 1500° C. to 1600° C.

The metal layer 80 is formed on the lower surface 20A of the ceramic substrate 20 in order to improve the wettability to the seal member 50 (refer to FIG. 1A), which is formed from a low-melting-point alloy in a subsequent step.

Figure 4B:
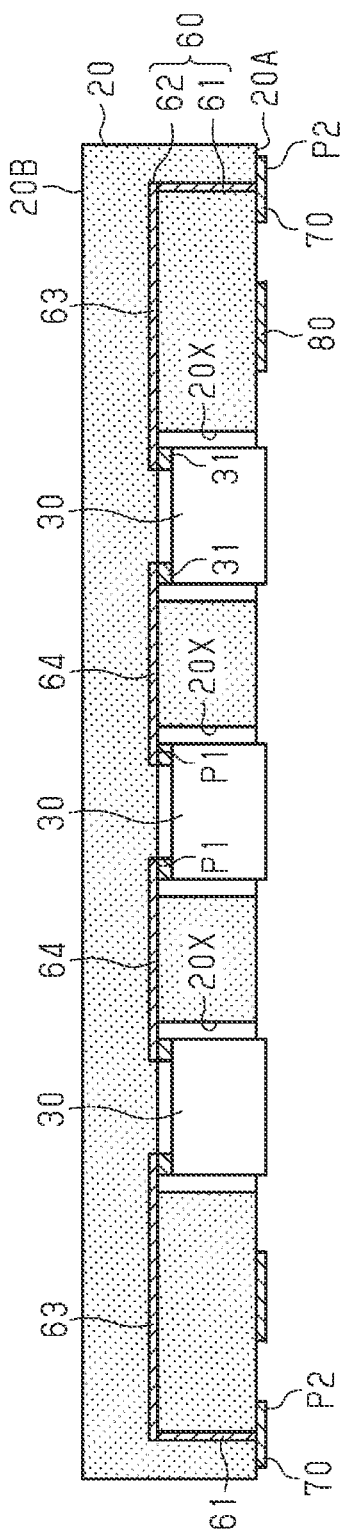

In the step illustrated in FIG. 4B, the light emitting element 30 is mounted on the two connection pads P1 arranged in each recess 20X of the ceramic substrate 20. For example, the bumps 31 of the light emitting elements 30 are flip-chip-bonded to the respective connection pads P1 arranged in each recess 20X. For example, when the bumps 31 are gold bumps, the bumps 31 are fixed to the connection pads P1 by ultrasonic bonding. In this step, the light emitting elements 30 are individually accommodated in the recesses 20X.

In the step illustrated in FIG. 5A, the heat dissipation member 40 is bonded to the lower surface 20A of the ceramic substrate 20 by the seal member 50. In the present embodiment, the seal member 50 is formed from a low-melting-point alloy. The lower surface 20A of the ceramic substrate 20 and the upper surface 40A of the heat dissipation member 40 are surfaces that are wet to the seal member 50 formed from a low-melting-point alloy. In the present embodiment, in the steps illustrated in FIGS. 3B and 4A, before baking, a high-melting-point metal paste is printed on the lower surface of the green sheet 22 to form the metal layer 80A. Then, the metal layer 80A and the green sheets 21 and 22 are simultaneously baked, so that the metal layer 80 is formed on the lower surface 20A of the ceramic substrate 20. The formation of the metal layer 80 forms a metallized surface on the lower surface 20A of the ceramic substrate 20 that wets to the seal member 50 formed from a low-melting-point alloy. In the present embodiment, the heat dissipation member 40 is formed from copper or a copper alloy, which have high wettability to a low-melting-point alloy. A surface-processed layer is formed on a surface of the heat dissipation member 40 where appropriate to inhibit oxidation of the surface. The surface-processed layer is a metal layer having a high wettability to a low-melting-point alloy. In the heat dissipation member 40 of the present embodiment, the upper surface 40A and the side surface are wet surfaces.

In this step, the seal member 50 is bonded to the metal layer 80, which is formed on the lower surface 20A of the ceramic substrate 20, and the upper surface 40A and the side surface of the heat dissipation member 40. For example, the seal member 50 is alloyed with and bonded to the metal layer 80 and alloyed with and bonded to the heat dissipation member 40. As a result, the gap between the ceramic substrate 20 and the heat dissipation member 40 is hermetically sealed by the seal member 50. The seal member 50 may be formed, for example, through a printing process. Subsequently, the seal member 50 is bonded to the metal layer 80 and the heat dissipation member 40 through a reflow process.

In the present embodiment, the bonding surface of the ceramic substrate 20 (i.e., the lower surface of the metal layer 80) and the bonding surface of the heat dissipation member 40 (i.e., the upper surface 40A and side surface of the heat dissipation member 40) are flat. This improves the hermetical property of the seal member 50. When the seal member 50 is bonded to a surface having irregularities, the hermetical property of the seal member 50 may be lowered due to formation of a portion having an insufficient wettability and entrapment of air bubbles.

The connection pads P1 and the electrode terminals 70 are electrically connected by the wiring layers 61 and 62 arranged inside the ceramic substrate 20. Thus, the frame-shaped seal member 50 is electrically insulated from the wiring layers 61 and 62 by the ceramic substrate 20. This prevents, for example, the two electrode terminals 70 from shorting each other through the seal member 50.

In the present embodiment, before baking, a high-melting-point metal paste is printed on the lower surface of the green sheet 22 to form the metal layer 80A, and the metal layer 80A is baked to form the metal layer 80. The process for forming the metal layer 80 is not limited to such a structure. In an example, after baking, a metal paste formed from copper or nickel may be printed on the lower surface 20A of the ceramic substrate 20, and the metal paste may be baked at a lower temperature than the baking temperature of the ceramic substrate 20 to form the metal layer 80. In another example, after baking, the metal layer 80 may be formed on the lower surface 20A of the ceramic substrate 20 through a sputtering process. In this case, the metal layer 80 has a structure obtained by, for example, forming a tight contact layer on the lower surface 20A of the ceramic substrate 20 and stacking a metal layer formed from a metal (e.g., nickel) having high wettability to a low-melting-point alloy on the tight contact layer. The material of the tight contact layer may be a metal material having a high adhesion to the ceramic substrate 20. The material of the tight contact layer may be, for example, titanium (Ti), titanium nitride (TiN), tantalum nitride (TaN), tantalum (Ta), or chromium (Cr). When the surface roughness of the lower surface 20A of the ceramic substrate 20 is high at a certain level, for example, a vapor deposition process may be performed so that the metal layer 80 is formed from a metal (e.g., nickel) having high wettability to a low-melting-point alloy.

In the present embodiment, the heat dissipation member 40 is formed from copper or a copper alloy. However, there is no limitation to such a structure. The heat dissipation member 40 may be, for example, ceramic. In this case, for example, a metal layer similar to the metal layer 80 is formed on a portion of the heat dissipation member 40 that will become a bonding surface so that a wet surface is formed on the portion of the heat dissipation member 40 that will become the bonding surface.

In the step illustrated in FIG. 5A, the light emitting elements 30 are bonded to the heat dissipation member 40. The rear surface (here, lower surface) of each light emitting element 30 is, for example, bonded to the heat dissipation member 40 by the adhesive 35.

In the present embodiment, the light emitting elements 30 are bonded to the heat dissipation member 40 by the adhesive 35. However, the process for bonding the light emitting elements 30 to the heat dissipation member 40 is not limited to such a structure. For example, a sputtering process may be performed to form a metal layer on the lower surfaces of the light emitting elements 30, and the metal layer is alloyed with the heat dissipation member 40 so that the light emitting elements 30 are bonded to the heat dissipation member 40. In this case, the metal layer formed on the lower surfaces of the light emitting elements 30 serves as a light reflecting member that reflects the light emitted from the light emitting elements 30. The metal layer formed on the lower surfaces of the light emitting elements 30 may be bonded to the heat dissipation member 40 at the same time as the ceramic substrate 20 is bonded to the heat dissipation member 40 or at a different time from when the ceramic substrate 20 is bonded to the heat dissipation member 40. When the two bonding processes are performed at different points in time, for example, the material of the metal layer formed on the lower surfaces of the light emitting elements 30 has a melting point that shifts to a higher temperature after the material melts when bonded to the heat dissipation member 40.

In the step illustrated in FIG. 5B, the external connection terminals 90 are formed on the lower surfaces of the electrode terminals 70, that is, the external connection pads P2.

The light emitting device 10 illustrated in FIG. 1A is manufactured through the manufacturing steps described above.

The present embodiment has the advantages described below.

(1) The seal member 50 is arranged to hermetically seal the gap between the ceramic substrate 20 and the heat dissipation member 40, and the light emitting elements 30 are arranged in the space surrounded by the ceramic substrate 20, the heat dissipation member 40, and the seal member 50. That is, the seal member 50 hermetically seals the space in which the light emitting elements 30 are arranged. This appropriately limits entrance of moisture and the like into the space in which the light emitting elements 30 are arranged.

Consequently, deterioration of the light emitting elements 30 due to moisture and the like is appropriately limited.

(2) The wirings 60 are arranged inside the ceramic substrate 20 and are electrically connected to the light emitting elements 30. The wirings 60 include the wiring layers 62 extending in the planar direction of the ceramic substrate 20. The wiring layers 62 draw the wirings 60, which are electrically connected to the light emitting elements 30, to the outside of the space that is hermetically sealed by the seal member 50. As a result, the wirings 60 are drawn through the inside of the ceramic substrate 20 to the outside of the space hermetically sealed by the seal member 50. This eliminates the need for drawing the wirings 60 through the portion where the seal member 50 is formed between the ceramic substrate 20 and the heat dissipation member 40 when drawing the wirings 60 to the outside of the hermetically sealed space. Since the portion where the seal member 50 is formed between the ceramic substrate 20 and the heat dissipation member 40 is free of the wirings 60, the hermetical property of the seal member 50 is obtained in a preferred manner.

(3) The electrode terminals 70 are arranged on the lower surface 20A of the ceramic substrate 20 at an outer side of the seal member 50. The wirings 60 arranged inside the ceramic substrate 20 electrically connect the light emitting elements 30 to the electrode terminals 70. The wirings 60 extend inside the ceramic substrate 20 over the seal member 50. In this structure, the light emitting elements 30 and the electrode terminals 70 are electrically connected by the wirings 60 that extend inside the ceramic substrate 20 without extending through the portion where the seal member 50 is formed. Since the portion where the seal member 50 is formed between the ceramic substrate 20 and the heat dissipation member 40 is free of the wirings 60, the hermetical property of the seal member 50 is obtained in a preferred manner.

(4) The recesses 20X are arranged in the lower surface 20A of the ceramic substrate 20. The light emitting elements 30 are individually accommodated in the recesses 20X. In this structure, each recess 20X may accommodate one light emitting element 30. This hinders adjacent ones of the light emitting elements 30 from contacting each other.

(5) The seal member 50 is formed from a low-melting-point alloy. The metal layer 80 arranged on the lower surface 20A of the ceramic substrate 20 is formed from a metal material having a high wettability to the low-melting-point alloy forming the seal member 50. In this structure, even when the surface of the ceramic substrate 20 has a low wettability to the low-melting-point alloy forming the seal member 50, the metal layer 80 may be metalized on the surface of the ceramic substrate 20 so that the seal member 50 is appropriately bonded to the ceramic substrate 20 (metal layer 80). Thus, even when the surface of the ceramic substrate 20 has the low wettability to the low-melting-point alloy forming the seal member 50, the hermetic property of the seal member 50 is obtained in a preferred manner.

It should be apparent to those skilled in the art that the foregoing embodiments may be implemented in many other specific forms without departing from the scope of this disclosure. Particularly, it should be understood that the foregoing embodiments may be implemented in the following forms.

The embodiment described above and the modified examples described below can be combined as long as the combined modifications remain technically consistent with each other.

In the embodiment, the ceramic substrate 20 covers the side surface and the upper surface of the wiring layer 61. However, there is no limitation to such a structure. For example, the side surface of the wiring layer 61 may be exposed from the ceramic substrate 20.

Figure 6:
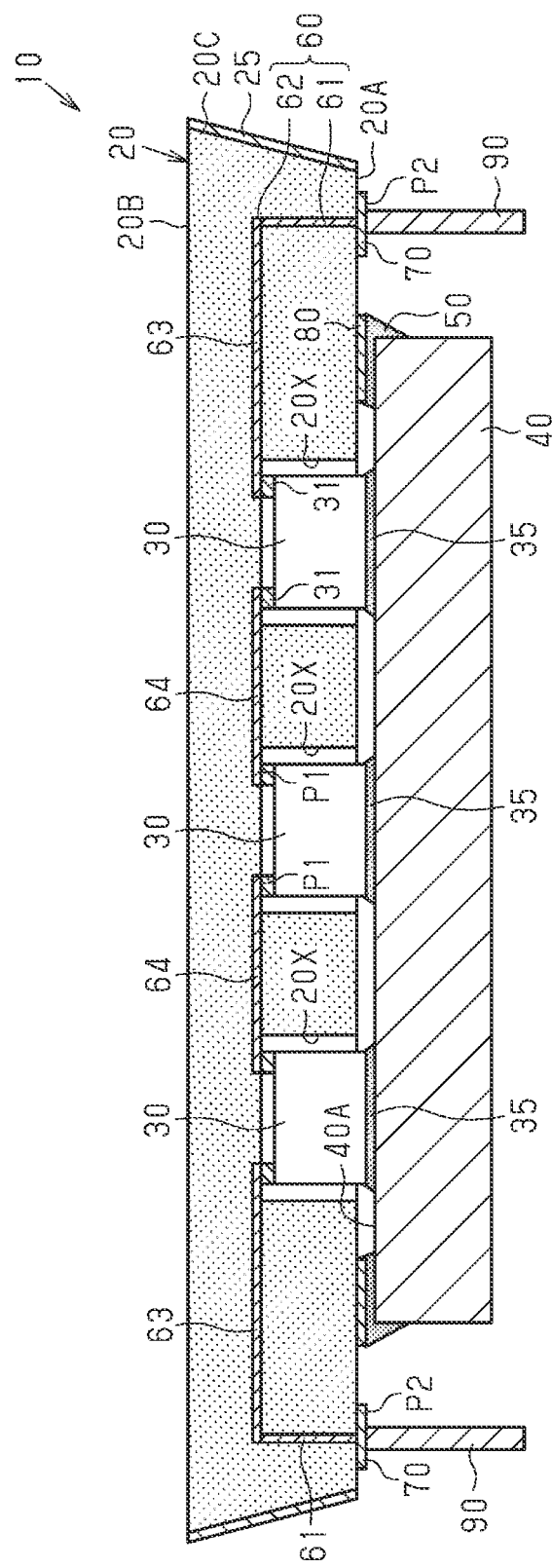
FIGS. 6, 7, 8, 9, and 10 are schematic cross-sectional views illustrating various modified examples of light emitting devices.

As illustrated in FIG. 6, the side surface of the ceramic substrate 20 may be defined by an inclined surface 20C, and a light reflecting film 25 may be formed on the inclined surface 20C. The inclined surface 20C is inclined, for example, toward the planar center of the ceramic substrate 20 (center of the ceramic substrate 20 in plan view) as the inclined surface 20C extends from the upper surface 20B of the ceramic substrate 20 toward the lower surface 20A of the ceramic substrate 20. The inclined surface 20C is, for example, flat. The inclined surface 20C is formed, for example, on the entire side surface of the ceramic substrate 20. The light reflecting film 25 covers the inclined surface 20C. The light reflecting film 25 covers, for example, the entire inclined surface 20C. The light reflecting film 25 is, for example, inclined along the inclined surface 20C. The light reflecting film 25, for example, reflects the light emitted from the light emitting elements 30. For example, in the light emitted from the light emitting elements 30, the portion of the light directed in the planar direction of the ceramic substrate 20 is reflected by the light reflecting film 25 upward in FIG. 6. The material of the light reflecting film 25 may be, for example, a metal having a high light reflectance such as silver or a metal material formed from an alloy of such a metal. The light reflecting film 25 may be formed, for example, through a plating process, a sputtering process, a thermal spraying process, or a vapor deposition process.

Figure 7:
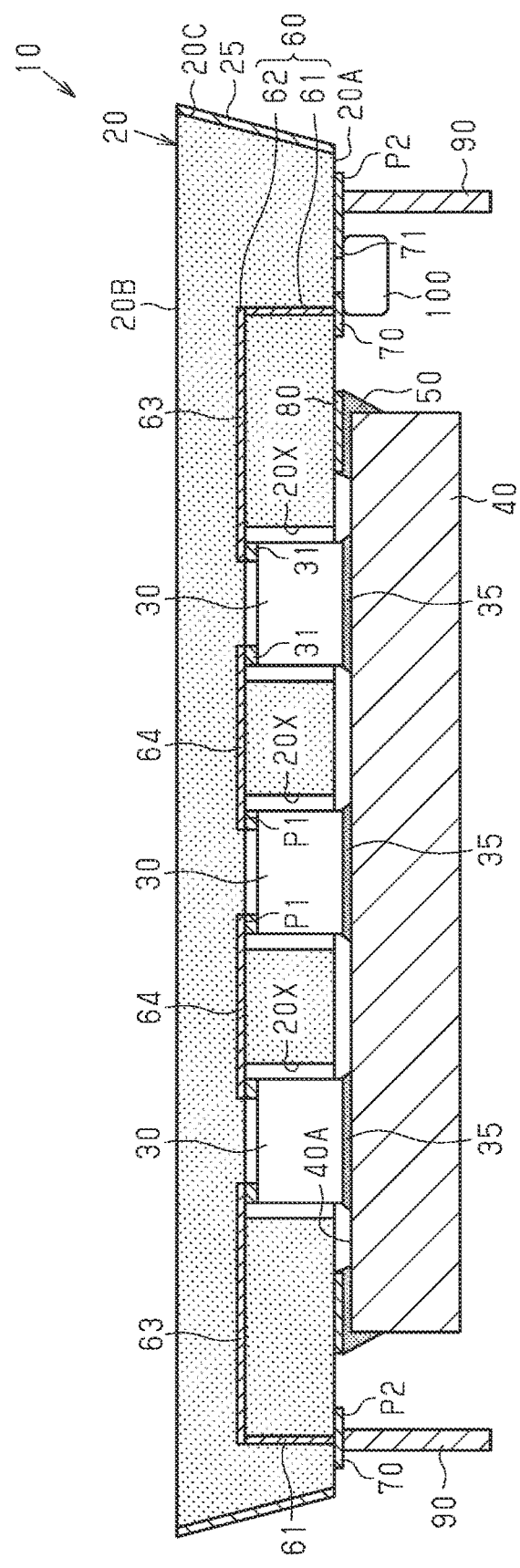

As illustrated in FIG. 7, an electronic component 100 may be mounted on the ceramic substrate 20. The electronic component 100 is, for example, mounted on the lower surface 20A of the ceramic substrate 20. For example, the electronic component 100 is mounted on electrode terminals 70 and 71 formed on the lower surface 20A of the ceramic substrate 20. The electronic component 100 is electrically connected to the electrode terminals 70 and 71. The electronic component 100 is, for example, mounted in the peripheral region at an outer side of the seal member 50. In this modified example, the electronic component 100 is mounted outside the space that is hermetically sealed by the seal member 50. The mode of mounting the electronic component 100 may be, for example, flip-chip mounting, wire bonding mounting, solder mounting, or a combination of these.

The electronic component 100 may be, for example, an active component such as a semiconductor chip, a transistor, or a diode, and/or a passive component such as a chip capacitor, a chip inductor, or a chip resistor.

The electrode terminal 71 is, for example, arranged separately from the electrode terminal 70. The electrode terminal 71 is, for example, arranged in a region located at an outer side of the electrode terminal 70. The lower surface of each electrode terminal 71 includes an external connection pad P2 configured to be connected to, for example, an external connection terminal 90.

In the modified example illustrated in FIG. 7, multiple electronic components 100 may be mounted on the ceramic substrate 20. There is no limitation as to a type of electronic component 100 mounted on the ceramic substrate 20. Different types of electronic component 100 may be mounted on the ceramic substrate 20. For example, an active electronic component 100 such as a semiconductor chip and a passive electronic component 100 such as a chip capacitor may be mounted on the ceramic substrate 20.

In the modified example illustrated in FIG. 7, the mount position of the electronic component 100 is not particularly limited. The electronic component 100 may be, for example, mounted in a region located at an inner side of the seal member 50. That is, the electronic component 100 may be arranged in the space that is hermetically sealed by the seal member 50. The electronic component 100 may be, for example, mounted on the upper surface 20B of the ceramic substrate 20. For example, the ceramic substrate 20 may include a recess for mounting the electronic component 100, and the electronic component 100 may be mounted in the recess.

Alternatively, the electronic component 100 may be mounted on the heat dissipation member 40. For example, the heat dissipation member 40 may include a recess for mounting the electronic component 100, and the electronic component 100 may be mounted in the recess.

In the embodiment, the light emitting elements 30 are individually accommodated in the recesses 20X. However, there is no limitation to such a structure. For example, two or more of the light emitting elements 30 may be accommodated in each recess 20X.

In the embodiment, the ceramic substrate 20 includes the recesses 20X. However, there is no limitation to such a structure. For example, the ceramic substrate 20 may include only one recess 20X, and the light emitting elements 30 may be accommodated in the recess 20X.

In the embodiment, the light emitting elements 30 are mounted in the recesses 20X formed in the ceramic substrate 20. However, there is no limitation to such a structure. The mount position of the light emitting elements 30 is not particularly limited and may be, for example, any position in the space between the ceramic substrate 20 and the heat dissipation member 40.

Figure 8:
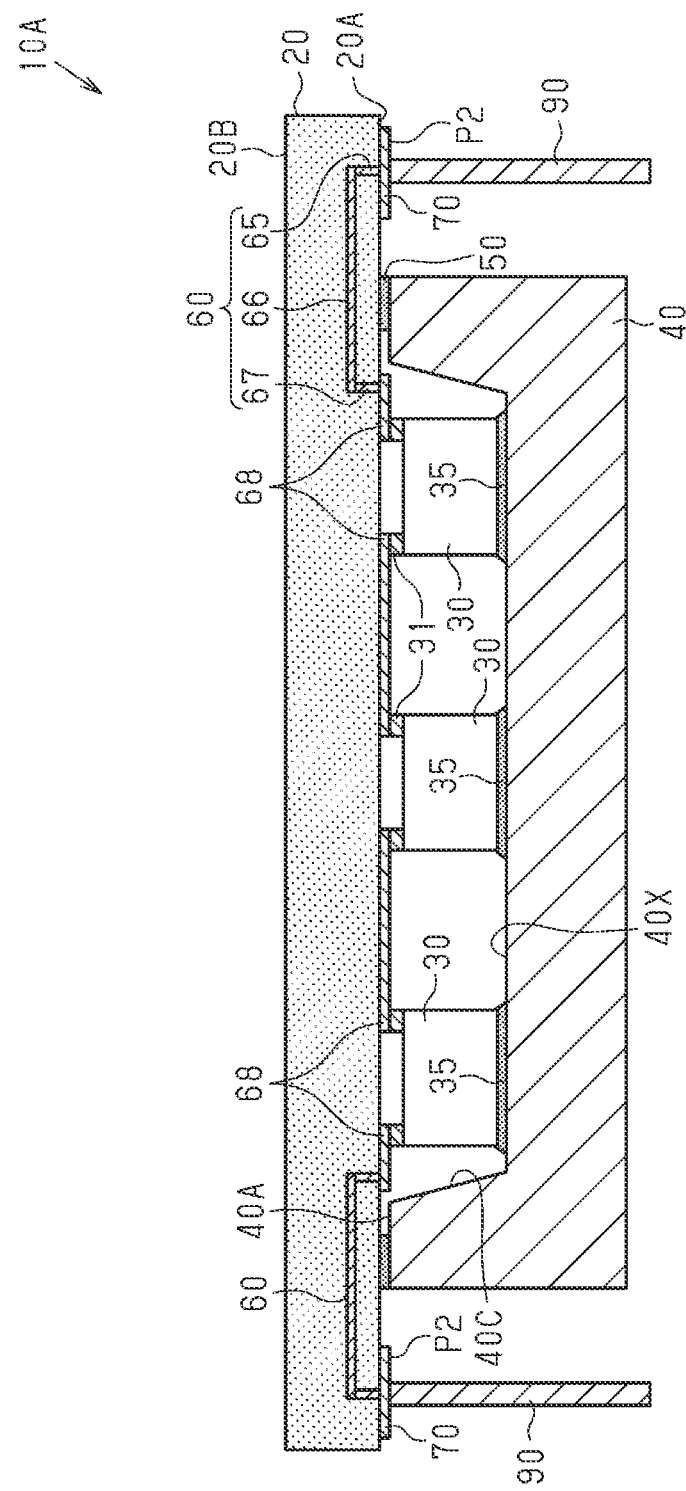

For example, as illustrated in FIG. 8, the light emitting elements 30 may be mounted on the lower surface 20A of the ceramic substrate 20. In this case, it is preferred that the heat dissipation member 40 includes a recess 40X accommodating the light emitting elements 30 mounted on the lower surface 20A of the ceramic substrate 20. The structure of a light emitting device 10A in this modified example will now be described.

The light emitting device 10A includes wirings 60 arranged inside the ceramic substrate 20, electrodes 68 arranged on the lower surface 20A of the ceramic substrate 20, and electrode terminals 70 arranged on the lower surface 20A of the ceramic substrate 20.

The wirings 60, for example, electrically connect the electrodes 68 to the electrode terminals 70. The wirings 60 include, for example, wiring layers 65 connected to the electrode terminals 70, wiring layers 66 connected to the wiring layers 65, and wiring layers 67 connected to the wiring layers 66.

The wiring layers 65 are, for example, directly connected to the respective electrode terminals 70. The lower surface of each wiring layer 65 is exposed from the lower surface 20A of the ceramic substrate 20. The lower surface of the wiring layer 65 is flush with the lower surface 20A of the ceramic substrate 20. The lower surface of the wiring layer 65 is directly connected to the upper surface of the electrode terminal 70. Thus, the wiring layer 65 is electrically connected to the electrode terminal 70. The wiring layer 65 is rod-shaped and extends upward from the lower surface 20A of the ceramic substrate 20. The upper surface of the wiring layer 65 is connected to the lower surface of the wiring layer 66.

The wiring layers 66 are elongated so as to extend in the planar direction of the ceramic substrate 20. Each wiring layer 66 has two longitudinal ends. For example, the lower surface of one of the longitudinal ends is connected to the upper surface of the wiring layer 65, and the lower surface of the other longitudinal end is connected to the upper surface of the wiring layer 67. The wiring layer 66, for example, traverses the seal member 50 in plan view.

Each wiring layer 67 electrically connects the wiring layer 66 to the electrode 68. The upper surface of the wiring layer 67 is connected to the lower surface of the wiring layer 66. The wiring layer 67 is rod-shaped and extends downward from the lower surface of the wiring layer 66. The lower surface of the wiring layer 67 is connected to the electrode 68. The lower surface of the wiring layer 67 is exposed from the lower surface 20A of the ceramic substrate 20. The lower surface of the wiring layer 67 is flush with the lower surface 20A of the ceramic substrate 20. The lower surface of the wiring layer 67 is directly connected to the upper surface of the electrode 68.

As described above, the wirings 60, which include the wiring layers 65 to 67, are arranged inside the ceramic substrate 20 and extend over the seal member 50. The ceramic substrate 20 is arranged between the seal member 50 and the wirings 60.

The electrodes 68 are arranged separately from each other on the lower surface 20A of the ceramic substrate 20. The electrodes 68 are arranged in a region located at an inner side of the seal member 50. The electrodes 68 are electrically connected to the light emitting elements 30. The electrodes 68, for example, electrically connect the light emitting elements 30 to each other. In the same manner as the wiring layers 62 illustrated in FIG. 1A, the electrodes 68 of this modified example connect the light emitting elements 30 in parallel and series (refer to FIG. 2). As illustrated in FIG. 8, the three light emitting elements 30 arranged in a row (in sideward direction in FIG. 8) between the electrode terminals 70 are connected in series by the electrodes 68. The electrodes 68 are also electrically connected to the electrode terminals 70 through the wirings 60 arranged inside the ceramic substrate 20.

The heat dissipation member 40 includes the recess 40X formed in the upper surface 40A of the heat dissipation member 40, which faces the ceramic substrate 20. The recess 40X is recessed from the upper surface 40A of the heat dissipation member 40 toward the lower surface of the heat dissipation member 40. The bottom surface of the recess 40X is located at an intermediate position of the heat dissipation member 40 in the thickness-wise direction. The recess 40X has a depth such that the light emitting elements 30 are accommodated in the recess 40X. The recess 40X has a planar shape and a planar size such that, for example, the light emitting elements 30 are collectively accommodated in the recess 40X.

The recess 40X is formed so that the open width of the recess 40X is, for example, increased from the bottom surface of the recess 40X toward the upper surface 40A of the heat dissipation member 40. The inner wall surface of the recess 40X is, for example, defined by an inclined surface 40C. The inclined surface 40C is inclined, for example, toward the planar center of the heat dissipation member 40 (center of the heat dissipation member 40 in plan view) as the inclined surface 40C extends from the upper surface 40A of the heat dissipation member 40 toward the bottom surface of the recess 40X. The inclined surface 40C is, for example, flat. When the heat dissipation member 40 is formed from a material (e.g., metal material) that reflects the light emitted from the light emitting elements 30, the inclined surface 40C may serve as a light reflecting member. In this case, for example, in the light emitted from the light emitting elements 30, the portion of the light directed in the planar direction of the heat dissipation member 40 (sideward direction in FIG. 8) is reflected by the inclined surface 40C upward in FIG. 8.

The light emitting elements 30 are, for example, mounted on the electrodes 68 formed on the lower surface 20A of the ceramic substrate 20. Each light emitting element 30 is, for example, flip-chip-mounted on adjacent two electrodes 68 so as to extend between the two electrodes 68. For example, in each light emitting element 30, one of the two bumps 31 is flip-chip-mounted on one of the electrodes 68, and the other one of the bumps 31 is flip-chip-mounted on the other electrode 68. Thus, the light emitting element 30 is electrically connected to the electrodes 68 by the bumps 31. The light emitting element 30 is electrically connected to the electrode terminals 70 by the electrodes 68 and the wirings 60 (wiring layers 65 to 67). The light emitting elements 30 emit light when supplied with power from the external power supply (not illustrated) through the external connection terminals 90, the electrode terminals 70, the wirings 60, and the electrodes 68.

The light emitting elements 30 are accommodated, for example, in the recess 40X of the heat dissipation member 40. The light emitting elements 30 are, for example, surrounded by the inner wall surface (i.e., the inclined surface 40C) of the heat dissipation member 40.

The lower surface of each light emitting element 30 is, for example, connected to the heat dissipation member 40 by the adhesive 35. The lower surface of the light emitting element 30 is, for example, connected to the bottom surface of the recess 40X through the adhesive 35. The light emitting element 30 is thermally connected to the heat dissipation member 40 by the adhesive 35.

The seal member 50 is arranged between the lower surface 20A of the ceramic substrate 20 and the upper surface 40A of the heat dissipation member 40. The seal member 50 hermetically seals the space between the lower surface 20A and the upper surface 40A located at an outer side of the recess 40X. The seal member 50 hermetically seals the space in which the light emitting elements 30 are arranged. The light emitting elements 30 are arranged in a space surrounded by the ceramic substrate 20, the heat dissipation member 40, and the seal member 50. That is, the light emitting elements 30 are hermetically sealed in the space between the ceramic substrate 20 and the heat dissipation member 40 by the seal member 50.

In the present embodiment, the seal member 50 is, for example, formed from low-melting-point glass. Hence, the metal layer 80 of the embodiment is omitted. In this case, the seal member 50 is bonded to the lower surface 20A of the ceramic substrate 20 and the upper surface 40A of the heat dissipation member 40. The seal member 50 is, for example, in tight contact with the lower surface 20A of the ceramic substrate 20 and the upper surface 40A of the heat dissipation member 40 with no opening.

The seal member 50 is arranged between the electrodes 68 and the electrode terminals 70 in plan view. The seal member 50 is arranged between the light emitting elements 30 and the electrode terminals 70 in plan view. In plan view, the seal member 50 is frame-shaped and surrounds the light emitting elements 30.

The thickness of the seal member 50 may be set, for example, in accordance with the relationship of the thickness of the light emitting elements 30, the thickness of the adhesive 35, and the depth of the recess 40X. For example, the thickness of the seal member 50 is set to absorb variations in the dimensions of the thickness of the light emitting elements 30, the thickness of the adhesive 35, and the depth of the recess 40X.

The structure of the modified example illustrated in FIG. 8 obtains advantages similar to those of the embodiment.

In the modified example illustrated in FIG. 8, the electrodes 68 may be arranged in the ceramic substrate 20. For example, the side surfaces of the electrodes 68 may be covered by the ceramic substrate 20. In this case, for example, the lower surfaces of the electrodes 68 are flush with the lower surface 20A of the ceramic substrate 20.

In the modified example illustrated in FIG. 8, the heat dissipation member 40 includes the recess 40X configured to collectively accommodate the light emitting elements 30. However, there is no limitation to such a structure. The heat dissipation member 40 may include, for example, recesses configured to individually accommodate the light emitting elements 30. In this case, for example, each recess accommodates one light emitting element 30.

In the modified example illustrated in FIG. 8, the electronic component 100 may be accommodated in the recess 40X.

In the embodiment, the external connection terminals 90 are arranged on the external connection pads P2. However, there is no limitation to such a structure.

Figure 9:
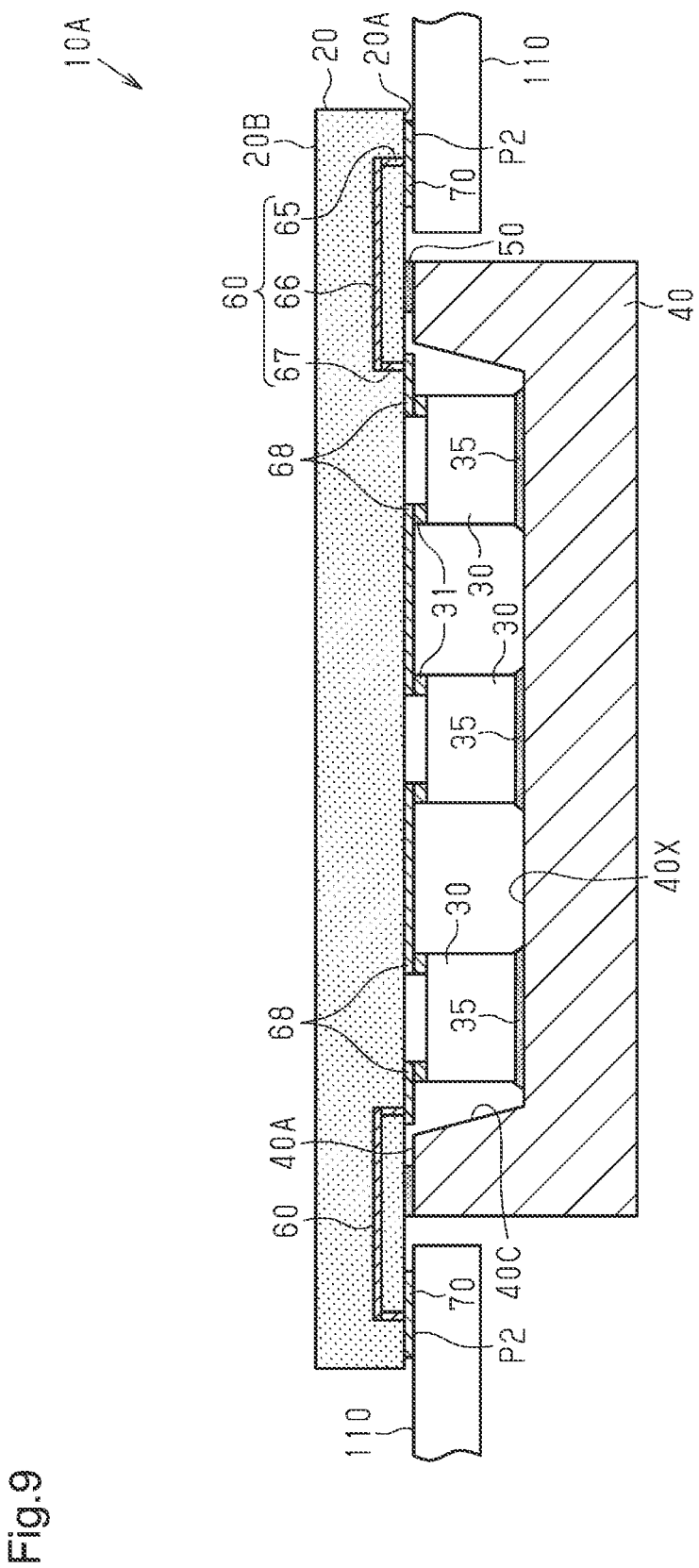

For example, as illustrated in FIG. 9, substrates 110, which are, for example, wiring substrates different from the ceramic substrate 20, may be arranged on the external connection pads P2. For example, electrodes (not illustrated) are arranged on the upper surfaces of the substrates 110 and electrically connected to the external connection pads P2 (electrode terminals 70). In this case, the light emitting elements 30 are supplied with power from the external power supply (not illustrated) through, for example, the substrates 110, the electrode terminals 70, the wirings 60, and the electrodes 68. Electrode terminals for supplying power may be arranged separately from the electrode terminals 70.

In the embodiment, the electrode terminals 70 are arranged on the lower surface 20A of the ceramic substrate 20. However, there is no limitation to such a structure.

Figure 10:
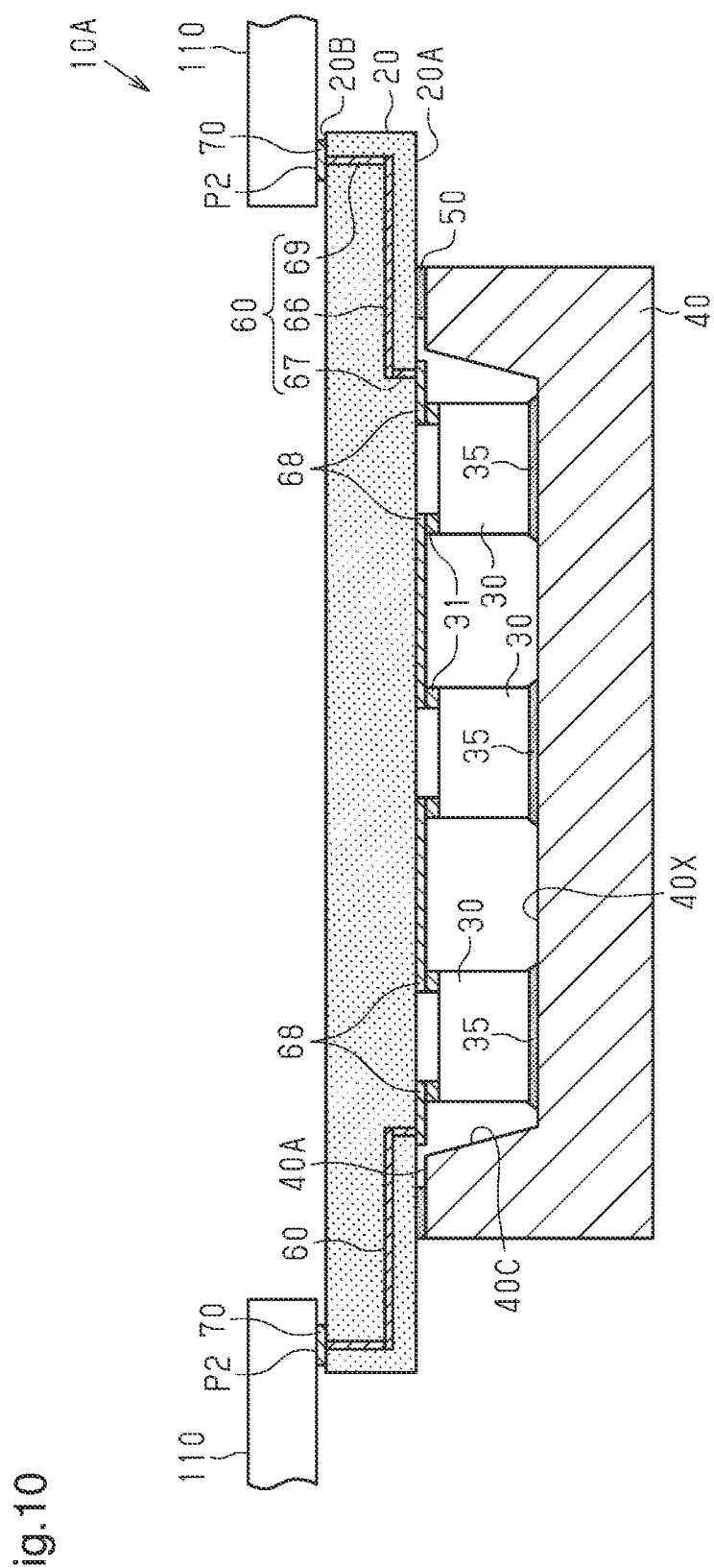

For example, as illustrated in FIG. 10, the electrode terminals 70 may be arranged on the upper surface 20B of the ceramic substrate 20. In this modified example, the substrates 110 are arranged on the upper surfaces of the electrode terminals 70, that is, the external connection pads P2. For example, electrodes (not illustrated) are arranged on the lower surfaces of the substrates 110 and electrically connected to the external connection pads P2 (electrode terminals 70).

In this case, each wiring 60 includes, for example, a wiring layer 67 connected to the electrode 68, a wiring layer 66 connected to the wiring layer 67, and a wiring layer 69 connected to the wiring layer 66. Each wiring layer 69 electrically connects the wiring layer 66 to the electrode terminal 70. The lower surface of the wiring layer 69 is connected to the upper surface of the wiring layer 66. The wiring layer 69 is rod-shaped and extends upward from the upper surface of the wiring layer 66. The upper surface of the wiring layer 69 is connected to the electrode terminal 70. The upper surface of the wiring layer 69 is exposed from the upper surface 20B of the ceramic substrate 20. The upper surface of the wiring layer 69 is flush with the upper surface 20B of the ceramic substrate 20. The upper surface of the wiring layer 69 is directly connected to the lower surface of the electrode terminal 70.

In the modified examples illustrated in FIGS. 9 and 10, instead of the substrates 110, semiconductor packages may be arranged on the external connection pads P2.

In the modified example illustrated in FIG. 10, the external connection terminals 90 may be arranged on the external connection pads P2.

In the same manner as in the modified examples illustrated in FIGS. 9 and 10, the substrates 110 may be arranged on the external connection pads P2 of the light emitting device 10 illustrated in FIG. 1A.

In the embodiment, various types of cooling members or heat dissipating members such as a heat dissipation fin, a heat pipe, and a vapor chamber may be arranged below the heat dissipation member 40.

In the embodiment, in the space hermetically sealed by the seal member 50, an air layer is formed in the gap among the ceramic substrate 20, the light emitting elements 30, and the heat dissipation member 40. Instead, for example, in the space hermetically sealed by the seal member 50, the gap among the ceramic substrate 20, the light emitting elements 30, and the heat dissipation member 40 may be filled with a transparent resin or helium gas. When filled with the transparent resin, for example, the difference in the refractive index between the ceramic substrate 20 and the gap formed between the light emitting elements 30 and the ceramic substrate 20 is reduced. When filled with helium gas, the heat dissipation property is improved.

In the embodiment, the light emitting elements 30 are flip-chip-mounted on the ceramic substrate 20. However, the mode for mounting the light emitting elements 30 is not limited to such a structure. The light emitting elements 30 may be mounted on the ceramic substrate 20, for example, by wire bonding or using solder.

In the embodiment, the lower portion of the light emitting element 30 projects downward from the lower surface 20A of the ceramic substrate 20. However, there is no limitation to such a structure. For example, the entire light emitting element 30 may be accommodated in the recess 20X.

In the embodiment, the light emitting elements 30 are mounted on the ceramic substrate 20. However, there is no limitation to such a structure. For example, only one light emitting element 30 may be mounted on the ceramic substrate 20.

In the embodiment, the external connection terminals 90 may be omitted.

In the embodiment, the electrode terminals 70 may be omitted. In this case, for example, the lower surfaces of the wiring layers 61 serve as the external connection pads P2. For example, the external connection terminals 90 may be directly connected to the lower surfaces of the wiring layers 61.

In the embodiment and the modified examples, the ceramic substrate 20 or the heat dissipation member 40 includes the recesses 20X and 40X accommodating the light emitting elements 30. Instead, for example, both the ceramic substrate 20 and the heat dissipation member 40 may include recesses for accommodating the light emitting elements 30.

In the embodiment, the ceramic substrate 20 is embodied in a ceramic substrate having a wavelength conversion functionality. However, there is no limitation to such a structure. For example, the ceramic substrate 20 may be embodied in a ceramic substrate that does not have a wavelength conversion functionality. In this case, a fluorescence substance film having a wavelength conversion functionality may be arranged on the upper surface 20B or the lower surface 20A of the ceramic substrate 20.

In the embodiment, the base material is embodied in the heat dissipation member 40. However, the base material is not limited to the heat dissipation member 40 and may be, for example, any base material having a hermetical property.

In the embodiment, the structure of the wirings 60 is not particularly limited. For example, in the wirings 60, the number of layers and the routing may be modified and changed in various manners.

All examples and conditional language recited herein are intended for pedagogical purposes to aid the reader in understanding the principles of the invention and the concepts contributed by the inventors to furthering the art, and are to be construed as being without limitation to such specifically recited examples and conditions, nor does the organization of such examples in the specification relate to an illustration of the superiority and inferiority of the invention. Although embodiments have been described in detail, it should be understood that various changes, substitutions, and alterations could be made hereto without departing from the scope of this disclosure.

What is claimed is:
1. A light emitting device, comprising:
a light emitting element;
a light-transmissive ceramic substrate on which the light emitting element is mounted, the ceramic substrate including an upper surface serving as a light emitting surface and a lower surface facing to an upper surface of the light emitting element, and the ceramic substrate configured to transmit light emitted from the light emitting element and including a fluorescence substance having a wavelength conversion functionality;
a wiring arranged inside the ceramic substrate and electrically connected to the upper surface of the light emitting element;
a heat dissipation member faced to the ceramic substrate and connected to a lower surface of the light emitting element by an adhesive;
a seal member hermetically sealing a gap between the ceramic substrate and the heat dissipation member, wherein the light emitting element is arranged in a space surrounded by the ceramic substrate, the heat dissipation member, and the seal member; and
an electrode terminal arranged on the ceramic substrate outside the space, wherein:
the seal member is arranged between the light emitting element and the electrode terminal at a position that does not overlap each of the light emitting element and the electrode terminal in plan view;
the wiring electrically connects the light emitting element to the electrode terminal;
the wiring includes a wiring layer extending in a planar direction of the ceramic substrate;
the wiring layer is arranged inside the ceramic substrate so as to traverse the seal member in plan view; and
the electrode terminal is arranged on one of the upper surface and the lower surface of the ceramic substrate at an outer side of the heat dissipation member in plan view.

2. The light emitting device according to claim 1, wherein
the ceramic substrate includes a facing surface faced to the heat dissipation member and a recess arranged in the facing surface, and
the light emitting element is accommodated in the recess.

3. The light emitting device according to claim 1, wherein
the ceramic substrate includes a facing surface faced to the heat dissipation member and recesses arranged in the facing surface,
the light emitting element is one of light emitting elements, and
the light emitting elements are individually accommodated in the recesses.

4. The light emitting device according to claim 1, wherein
the ceramic substrate includes a side surface defined by an inclined surface, and
the light emitting device further comprises a light reflecting film arranged on the inclined surface.

5. The light emitting device according to claim 1, wherein
the heat dissipation member includes a facing surface faced to the ceramic substrate and a recess arranged in the facing surface, and
the light emitting element is accommodated in the recess of the heat dissipation member.

6. The light emitting device according to claim 5, wherein
the heat dissipation member is formed from a material that reflects light emitted from the light emitting element, and
the recess includes an inner wall surface defined by an inclined surface.

7. The light emitting device according to claim 1, wherein
the seal member is formed from a low-melting-point alloy or a low-melting-point glass.

8. The light emitting device according to claim 1, wherein
the seal member is annularly arranged to surround the light emitting element in plan view.

9. The light emitting device according to claim 1, wherein
the ceramic substrate includes a facing surface faced to the heat dissipation member,
the light emitting device further comprises a metal layer arranged on the facing surface of the ceramic substrate, wherein
the seal member is formed from a low-melting-point alloy,
the metal layer is formed from a metal material having a higher wettability to the low-melting-point alloy than the ceramic substrate, and
the seal member is bonded to the metal layer and the heat dissipation member.

10. The light emitting device according to claim 9, wherein
the metal layer is annularly arranged to surround the light emitting element in plan view, and
the metal layer overlaps the seal member in plan view.

* * * * *